(12) United States Patent
Ikeda et al.

(10) Patent No.: US 7,199,030 B2
(45) Date of Patent: Apr. 3, 2007

(54) METHOD OF MANUFACTURING SEMICONDUCTOR DEVICE

(75) Inventors: Satoshi Ikeda, Tokyo (JP); Yutaka Kamata, Miyagi (JP); Ikuo Kurachi, Tokyo (JP); Norio Hirashita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/446,078

(22) Filed: May 28, 2003

(65) Prior Publication Data

US 2004/0067626 A1    Apr. 8, 2004

(30) Foreign Application Priority Data

Oct. 7, 2002    (JP)    ............... 2002-293542

(51) Int. Cl.
*H01L 21/425* (2006.01)
*H01L 21/265* (2006.01)

(52) U.S. Cl. ............ 438/522; 438/514; 438/530; 257/E21.324; 257/E21.337

(58) Field of Classification Search ........... 438/530, 438/12, 46, 199, 207, 217, 305, 369, 370, 438/424, 440, 443, 450, 505, 506, 511, 514, 438/522, 532, 542, 551, 571, 559, 664, 692, 438/922, 308, 795, 923, 142, 197, 510, 914
See application file for complete search history.

(56) References Cited

U.S. PATENT DOCUMENTS 4,098,618 A * 7/1978 Crowder et al. ............ 438/440
5,903,029 A * 5/1999 Hayashida et al. ......... 257/344
5,960,319 A   9/1999 Iwata et al.
5,972,760 A * 10/1999 Ju ............................... 438/305
6,022,793 A   2/2000 Wijaranakula et al.
6,221,743 B1  4/2001 Fujikawa et al.
6,281,081 B1 * 8/2001 Chien et al. ................ 438/296
6,429,135 B1  8/2002 Chern et al.
6,447,600 B1  9/2002 Furukawa et al.
6,451,704 B1 * 9/2002 Pradeep et al. ............. 438/719

FOREIGN PATENT DOCUMENTS

| JP | 5-129593  | 5/1993  |
| JP | 05-211165 | 8/1993  |
| JP | 7-135208  | 5/1995  |
| JP | 8-339970  | 12/1996 |

(Continued)

OTHER PUBLICATIONS

Wolf and Tauber, Silicon Processing for the VSLI Era, vol. 1, Lattice Press, 2000, pp. 394-395, 398, 419.*

(Continued)

*Primary Examiner*—Alexander Ghyka
(74) *Attorney, Agent, or Firm*—Rabin & Berdo, PC

(57) ABSTRACT

An impurity is ion-implanted with a silicon nitride film formed on a silicon substrate as a mask film to form a source/drain layer of a MOS transistor. Heat treatment for activating the impurity is done as it is without removing the silicon nitride film to thereby produce heat treatment-based stress between the silicon nitride film and the silicon substrate.

4 Claims, 1 Drawing Sheet

FOREIGN PATENT DOCUMENTS

| | | |
|---|---|---|
| JP | 11-003869 | 1/1999 |
| JP | 11-026390 | 1/1999 |
| JP | 2000-174029 | 6/2000 |
| JP | 2001-223219 | 8/2001 |

OTHER PUBLICATIONS

Ohring, Milton, Materials Science of Thin Films, 2nd ed., Academic, 2002. pp. 51-52, 742-744, 750-763.*

Geankopolis, Transport Processes and Unit Operations, $3^{rd}$ ed., Prentice, 1993, pp. 44-46.*

Macosko, Christopher, Rheology, Principles, Measurements, and Applications, Wiley-VCH, 1994, pp. 8-9, and 40.*

*In situ* X-ray topographic study of the dislocation mobility in high-purity and impurity-doped silicon crystals Philosophical Magazine A, 1983, vol. 47, No. 4, 599-621.

* cited by examiner

METHOD OF MANUFACTURING SEMICONDUCTOR DEVICE

BACKGROUND OF THE INVENTION

1. Field of the Invention

The present invention relates to a method of manufacturing a semiconductor device wherein a high concentration diffusion layer is formed by an ion implantation method, and particularly to a method of. realizing a high concentration diffusion layer free of crystal lattice defects.

2. Description of the Related Art

When manufacturing a semiconductor device, an ion implantation method has heretofore been widely used as a technology for introducing electrically active impurities. An impurity semiconductor needs to have introduced impurities serving as dopant into a semiconductor material. The ion implantation method is used as one of the introducing methods.

Since, for example, high energy ions are injected into a semiconductor crystal in the ion implantation method, crystal lattice defects occur due to collisions between the ions and a crystal lattice, so that crystallizability is broken. Therefore, ion implantation has been performed through a mask film such as a silicon oxide film or the like to reduce damage to a crystal or the like (see Japanese Patent Publication Laid-Open No. Hei 5(1993)-211165). Further, high-temperature heat treatment is done to recover the crystallizability. Simultaneously, the electrical activation of implanted dopant impurity atoms has been carried out.

Since, however, damage to a silicon substrate crystal is serious in the case of ion implantation of a source/drain or the like increased in dose in a silicon semiconductor device, for example, there is a need to perform post-ion implantation heat treatment at a high temperature or for a long time in order to promote damage recovery. However, such heat treatment diffuses a dopant impurity more than necessary. Thus, a problem such as a short channel effect or the like will arise in a micro device. It is therefore difficult to sufficiently recover crystal lattice defects without any problem.

SUMMARY OF THE INVENTION

The present invention aims to perform high concentration ion implantation through a mask film corresponding to a silicon nitride film or a silicon oxynitride film formed on a silicon substrate, executing heat treatment without removing the mask film, and thereby reducing crystal lattice defects of the silicon substrate.

The present invention also aims to form a silicon nitride film or a silicon oxynitride film on a silicon substrate with crystal lattice defects produced therein, and executing heat treatment with these films remaining formed thereon, thereby allowing the crystal lattice defects in the silicon substrate to disappear.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

A preferred embodiment of the present invention will hereinafter be described in detail with reference to the accompanying drawings.

Figure 1:
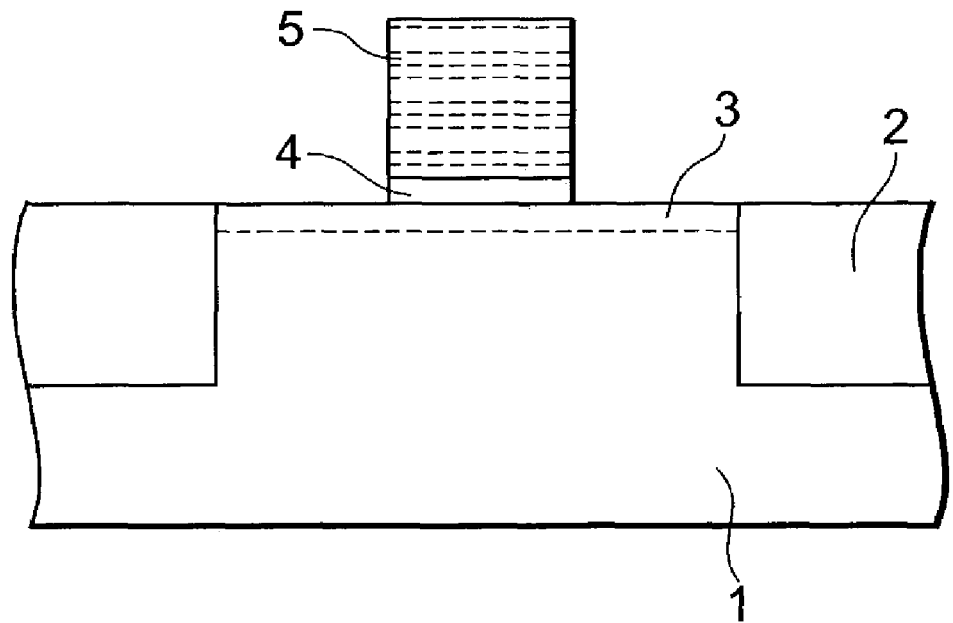
FIG. 1 is a process diagram showing a MOS transistor manufacturing method for describing an embodiment of the present invention.
Figure 2:
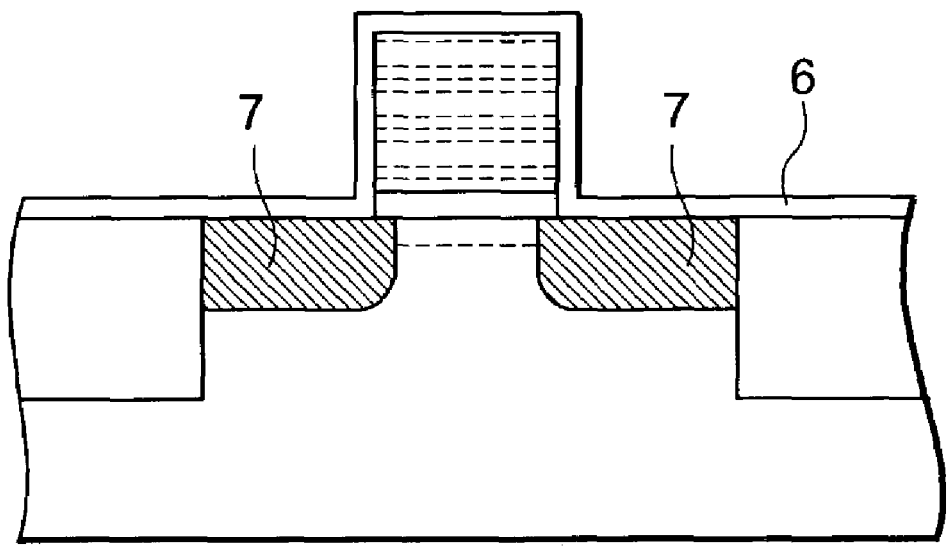
FIG. 2 is a process diagram illustrating the MOS transistor manufacturing method for describing the embodiment of the present invention in succession to FIG. 1.

FIGS. 1 and 2 are cross-sectional views of a process of manufacturing a MOS semiconductor device, which is used for describing an embodiment of the present invention. Device isolation regions 2 are formed in a silicon substrate 1, and a channel dope layer 3 for threshold control is formed by an ion implantation method. A gate electrode 5 is formed of a gate oxide film 4 and polycrystal silicon (see FIG. 1).

Subsequently, a silicon nitride film 6 having a thickness of about 10 nm is continuously deposited over the whole surface at a low temperature by a CVD method. The silicon nitride film 6 is directly deposited on the silicon substrate corresponding to regions which serve as a source and a drain. Further, arsenic (As) corresponding to an N type impurity is ion-implanted under conditions of a dose of 1E16 atoms per square centimeter, and an acceleration of 60 KeV, whereby source/drain regions 7 are formed on a self-alignment basis.

Thereafter, heat processing is done at 900° C. for 30 seconds by a RTA (Rapid Thermal Anneal) method to activate the arsenic element injected into the source/drain layers 7. At this time, the silicon nitride film 6 used as a mask film is heat-treated without being removed (see FIG. 2) In the case of the silicon nitride film mask according to the present embodiment, an area or surface density of a crystal dislocation at a depth of about 100 nm in the neighborhood of the surface of the silicon substrate as viewed from the surface of the silicon substrate is about 5E7 atoms per square centimeter. In the case of the same ion implantation and the same heat treatment conditions using a silicon oxide film mask having a thickness of 10 nm, an area or surface density of a crystal dislocation reaches about 2.3E9 atoms per square centimeter. Therefore, a defect reducing effect of the present embodiment is considered to be very high.

In the present embodiment, the ion implantation of the source/drain is carried out through the silicon nitride film and thereafter the process of activating the impurity is performed according to a rapid thermal anneal method. Further, the silicon nitride film is formed on the silicon substrate. Therefore, a shear stress is produced between the silicon substrate and the silicon nitride film. Under the conditions of the present embodiment, a pressure of about 1000 MPa at maximum by estimations is considered to be applied therebetween. As a result, it is considered that immobilized crystal lattice defects have disappeared (Production of stress in the silicon nitride film: see Japanese Patent Publication Laid-Open No. Hei 11 (1999)-3869).

According to a Reference (Philosophical Magazine A, 1983, VOL47, No. 4, pp599–621), when ion implantation is done using a silicon oxide film or a silicon nitride film mask, the oxygen element or nitrogen element injected into a silicon substrate by a knock-on phenomenon serves as an impurity which immobilizes a crystal dislocation in the silicon substrate.

When an oxygen impurity of about 1E18 atoms per cubic centimeter is dissolved in high-purity silicon, no crystal dislocation is moved unless a pressure of about 8 MPa or more is applied even if a high-temperature process is performed (see Japanese Patent Publication Laid-Open Nos. 2000-174029 and Hei 11(1999)-26390). On the other hand, when a nitrogen impurity of about 5E15 atoms per cubic centimeter is dissolved therein, no crystal dislocation is moved even under a high temperature unless a pressure of 5 MPa or more is applied. It is known that critical stress exists upon migration of the so-immobilized crystal dislocation and increases as the concentration of an impurity becomes high.

It is thus considered that the crystal dislocation immobilized by the impurity cannot be shifted unless very large pressure is applied. According to the foregoing Reference, a travelling speed v of the crystal dislocation is expressed by the following equation using stress $\tau$ and temperature T:

$$v = v_0 (\tau/\tau_0) exp(-E/kT)$$

where k indicates the Boltzmann constant, $\tau_0$ indicates 1 Mpa, $v_0$ indicates a rate constant which is 1–4E4 m/s, and E indicates activation energy which is a value ranging from about 2.2 eV to about 2.35 eV. It can be understood from this equation, that the travelling speed of the crystal dislocation is proportional to the stress and increases with rises in temperature and stress.

When, for example, a pressure of 10 MPa more than the critical stress is applied, it is expected that the crystal dislocation has a traveling speed of a few μm per second under heat treatment conditions of 800° C. to 850° C. It has been confirmed that the knocked-on oxygen and nitrogen elements are immediately subjected to gettering by defects at a low temperature. Therefore, it is considered in the present embodiment that the stress applied from the silicon nitride film reaches the critical stress or more upon heat treatment and hence the immobilized crystal dislocation has moved and disappeared from within the silicon surface.

While the silicon nitride film is directly formed on the silicon substrate as the mask film in the present embodiment, a silicon oxynitride film or the like for producing stress in the silicon substrate may be of course used. It is also feasible to form a silicon nitride film on a silicon substrate with the already-produced crystal lattice defects existent therein, and thereafter perform heat treatment to thereby produce stress in the silicon substrate and decrease the crystal lattice defects.

In the present invention, the ion implantation at high concentrations is performed through the insulating film large in film stress, and the heat treatment is executed as it is without removing the insulating film. The stress produced between the insulating film and the silicon substrate-upon the heat treatment allows migration and disappearance of the crystal lattice defects such as the immobilized crystal dislocation, etc. Therefore, transistors reduced in crystal lattice defect can be formed, thus resulting in realization of a semiconductor device high in reliability.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is called is:

1. A method of manufacturing a semiconductor device, comprising:
   forming a gate electrode on a gate insulating layer formed on a semiconductor substrate;
   forming a mask film selected from either a silicon nitride film or a silicon oxynitride film on the semiconductor substrate so that the gate electrode is covered by the mask film, and so that the mask film is in direct contact with a surface of the semiconductor substrate at areas immediately adjacent to the gate electrode;
   implanting impurity ions into the semiconductor substrate through the mask film; and
   activating the impurity ions implanted in the semiconductor substrate by executing a rapid thermal anneal method to the semiconductor substrate with the mask film, so as to produce stress by the mask film, between the mask film and the semiconductor substrate;
   wherein the mask film is directly formed on the semiconductor substrate at regions that serve as a source and a drain; and
   wherein the source and the drain extend under the gate electrode.

2. The method according to claim 1, wherein the semiconductor substrate is a silicon substrate.

3. A method of manufacturing a semiconductor device, comprising:
   forming a gate electrode on a gate insulating layer formed on a semiconductor substrate;
   forming a mask film selected from either a silicon nitride film or a silicon oxynitride film directly on the semiconductor substrate so that the gate electrode is covered by the mask film;
   implanting impurity ions into the semiconductor substrate through the mask film, wherein crystal lattice defects are generated in the semiconductor substrate; and
   producing stress between the mask film and the semiconductor substrate by heating the semiconductor substrate so as to reduce the crystal lattice defects in the semiconductor substrate;
   wherein the mask film is directly formed on the semiconductor substrate at regions that serve as a source and a drain; and
   wherein the source and the drain extend under the gate electrode.

4. The method according to claim 3, wherein the impurity ions implanted in the semiconductor substrate are activated by the heating.

* * * * *